US011227981B2

(12) United States Patent
Sato et al.

(10) Patent No.: US 11,227,981 B2
(45) Date of Patent: Jan. 18, 2022

(54) METHOD FOR MANUFACTURING LIGHT EMITTING DEVICE

(71) Applicant: NICHIA CORPORATION, Anan (JP)

(72) Inventors: Yoshiki Sato, Anan (JP); Kazuya Tamura, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/270,137

(22) Filed: Feb. 7, 2019

(65) Prior Publication Data
US 2019/0280170 A1 Sep. 12, 2019

(30) Foreign Application Priority Data

Mar. 8, 2018 (JP) .............................. JP2018-041694

(51) Int. Cl.
*H01L 33/56* (2010.01)
*H01L 33/62* (2010.01)
(Continued)

(52) U.S. Cl.
CPC .............. *H01L 33/56* (2013.01); *H01L 33/62* (2013.01); *H01L 23/544* (2013.01); *H01L 33/507* (2013.01); *H01L 33/60* (2013.01); *H01L 2223/5442* (2013.01); *H01L 2223/54426* (2013.01); *H01L 2933/005* (2013.01);
(Continued)

(58) Field of Classification Search
CPC ....... H01L 2924/181; H01L 2933/0033; H01L 21/78; H01L 2224/26175; H01L 33/56; H01L 21/56
See application file for complete search history.

(56) References Cited

U.S. PATENT DOCUMENTS 6,469,382 B1* 10/2002 Hotozuka ............... H01L 21/56
257/687
8,049,237 B2* 11/2011 Yamada .................. H01L 33/56
257/98
(Continued)

FOREIGN PATENT DOCUMENTS

JP 2007-207921 A 8/2007
JP 2012-089848 A 5/2012
(Continued)

*Primary Examiner* — Bradley Smith
*Assistant Examiner* — David J Goodwin
(74) *Attorney, Agent, or Firm* — Global IP Counselors, LLP

(57) ABSTRACT

A method for manufacturing a light emitting device includes: a substrate preparation step for preparing a substrate having a first region on which a plurality of light emitting devices are formed, and a second region surrounding the first region; a reinforcing member forming step for forming a reinforcing member by applying a resin material on the second region and hardening the resin material; a mounting step for mounting a plurality of light emitting elements on the first region; a light-transmissive member placing step for forming a plurality of light-transmissive members respectively on the light emitting elements; a sealing member forming step for sealing the plurality of light emitting elements and the plurality of light-transmissive members using a sealing member; and a cutting step for cutting the substrate and the sealing member and separating into individual light emitting devices.

15 Claims, 9 Drawing Sheets

(51) Int. Cl.
  *H01L 33/60* (2010.01)
  *H01L 23/544* (2006.01)
  *H01L 33/50* (2010.01)

(52) U.S. Cl.
  CPC .............. *H01L 2933/0041* (2013.01); *H01L 2933/0058* (2013.01); *H01L 2933/0066* (2013.01)

(56) References Cited

U.S. PATENT DOCUMENTS

| | | | |
|---|---|---|---|
| 9,520,542 B2* | 12/2016 | Tanenaka | H01L 33/52 |
| 10,388,582 B2* | 8/2019 | Kim | H01L 23/5384 |
| 2002/0053452 A1* | 5/2002 | Quan | H01L 21/56 |
| | | | 174/523 |
| 2006/0202220 A1* | 9/2006 | Hayashi | H01L 51/5246 |
| | | | 257/98 |
| 2007/0178629 A1 | 8/2007 | Ogawa et al. | |
| 2007/0257345 A1* | 11/2007 | Fan | H01L 23/3121 |
| | | | 257/678 |
| 2009/0166657 A1* | 7/2009 | Yamada | H01L 33/60 |
| | | | 257/98 |
| 2009/0239997 A1* | 9/2009 | Taguchi | C08G 77/28 |
| | | | 524/588 |
| 2010/0258830 A1* | 10/2010 | Ide | H01L 33/60 |
| | | | 257/98 |
| 2012/0097985 A1 | 4/2012 | Liu et al. | |
| 2013/0005210 A1* | 1/2013 | Takeda | H01L 24/97 |
| | | | 445/23 |
| 2013/0099273 A1* | 4/2013 | Shimizu | H01L 23/142 |
| | | | 257/99 |
| 2014/0042450 A1* | 2/2014 | Akiyama | H01L 33/56 |
| | | | 257/76 |
| 2015/0155450 A1* | 6/2015 | Oka | H01L 33/504 |
| | | | 257/98 |
| 2015/0303357 A1* | 10/2015 | Tanenaka | H01L 33/44 |
| | | | 257/88 |
| 2017/0154880 A1 | 6/2017 | Ozeki et al. | |
| 2017/0236982 A1* | 8/2017 | Akiyama | H05B 45/46 |
| | | | 315/185 R |
| 2018/0175267 A1* | 6/2018 | Hirasawa | H01L 23/12 |
| 2018/0226312 A1* | 8/2018 | Kim | H01L 21/561 |
| 2019/0140144 A1* | 5/2019 | Omori | H01L 33/56 |
| 2019/0374790 A1* | 12/2019 | Mori | A61N 5/06 |

FOREIGN PATENT DOCUMENTS

| | | |
|---|---|---|
| JP | 2013-084863 A | 5/2013 |
| JP | 2015076604 A | 4/2015 |
| JP | 2017108092 A | 6/2017 |
| WO | 2016021476 A1 | 2/2016 |

* cited by examiner

METHOD FOR MANUFACTURING LIGHT EMITTING DEVICE

CROSS-REFERENCE TO RELATED APPLICATIONS

This application claims priority to Japanese Patent Application No. 2018-041694 filed on Mar. 8, 2018, The entire disclosure of Japanese Patent Application No. 2018-041694 is hereby incorporated herein by reference.

Technical Field

The present disclosure relates to a method for manufacturing a light emitting device.

Background Art

In a substrate used in manufacturing of a light emitting deice, joining a plate Shaped reinforcing, material with higher rigidity than the substrate to the substrate is known (Japanese Laid-Open Patent Publication No. 2015-76604, for example). By doing this, it is possible to suppress warp deformation of the substrate.

SUMMARY

However, with the method noted above, there are cases when joining with good precision so that there is no position displacement between the reinforcing material and the substrate is difficult.

A method for manufacturing a light emitting device of an embodiment includes the following steps.

A method for manufacturing a light emitting device, comprising: a substrate preparation step for preparing a substrate that comprises a first region on which a plurality of light emitting devices are formed, and a second region surrounding the first region; a reinforcing member forming step for forming a reinforcing member by applying a resin material on the second region and hardening the resin material; a mounting step for mounting a plurality of light emitting dements on the first region; a light-transmissive member placing step for forming a plurality of light-transmissive members respectively on the light emitting elements; a sealing member forming step for sealing the plurality of light emitting elements and the plurality of light-transmissive members using a sealing member; and a cutting step for cutting the substrate and the sealing member and separating into individual light emitting devices.

By doing the above, using a relatively simple method, it is possible to provide a method for manufacturing a light emitting device with which it is possible to suppress warping of a substrate.

DETAIL DESCRIPTION OF EMBODIMENTS

Figure 1:
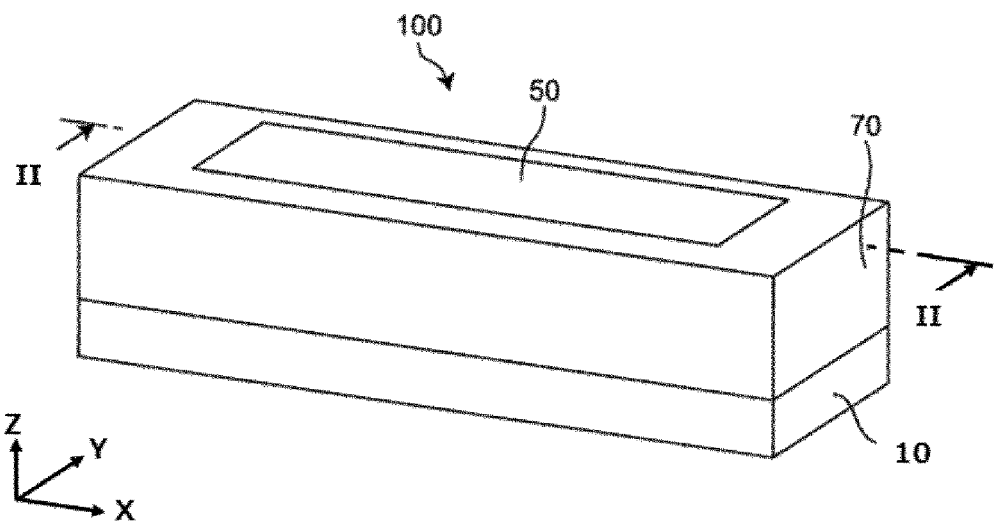
FIG. 1 is a schematic perspective view of a light emitting device 100 produced using a method for manufacturing a light emitting device of an embodiment of the present invention.

Following, a mode for carrying out the invention is explained while referring to drawings as appropriate. However, the method for manufacturing a light emitting device explained hereafter is for putting the technical concept of the present invention into specific form, and unless specifically noted, the present invention is not limited to the description below. Also, the size and positional relationship of members shown in the drawings may be exaggerated to clarify the explanation. Also, for members such as a substrate, base, light-transmissive member, light-transmissive resin, etc., the same name is used before and after hardening, and before and after cutting.

Figure 2:
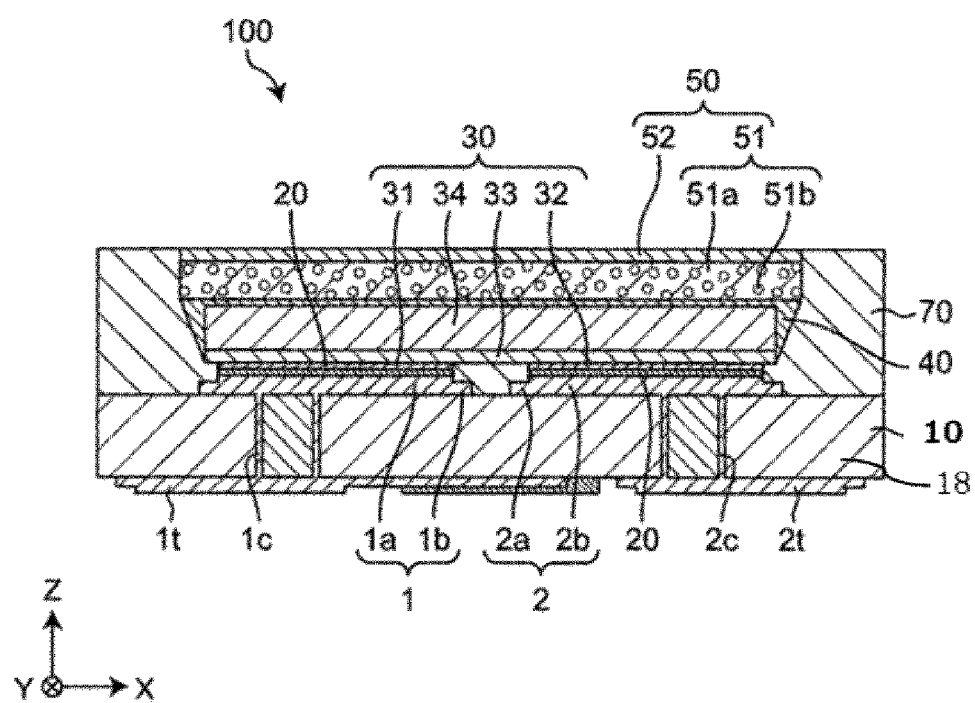
FIG. 2 is a schematic cross section view of line in FIG. 1.

FIG. 1 is a schematic perspective view of a light emitting device 100 which is an example produced using the method for manufacturing the light emitting device of an embodiment, and FIG. 2 is a cross section view of line II-II in FIG. 1.

The light emitting device 100 includes a substrate 10, a light emitting element 30, a light-transmissive member 50, and a sealing member 70. The substrate 10 has a base 18 and an electrically conductive member. The electrically conductive member has a first land electrode 1 and a second land electrode 2 provided on the top surface of the base 18, a first terminal electrode 1$t$ and a second terminal electrode 2$t$ provided on the bottom surface of the base 18, and a connection electrode 2c. The first land electrode 1 includes a first lower electrode 1b and a first projecting part 1a provided above the first lower electrode 1b. The second land electrode 2 includes a second lower electrode 2b and a second projecting part 2a provided above the second lower electrode 2b. Also, the first land electrode 1 is connected to the first terminal electrode 1t by a connection electrode 1c formed on the side surface of a through hole that pierces through the base 18 provided directly below the first land electrode 1. The second land electrode 2 is connected to the second terminal electrode 2t by a connection electrode 2c formed on the side surface of the through hole that pierces through the base 18 provided directly below the second land electrode 2. Here, the connection electrodes 1c, 2c are respectively provided on the inner wall of the through holes, and a filling material such as epoxy resin, etc., for example, is provided respectively on the inside of the connection electrodes 1c, 2c in the through holes.

The light emitting element 30, for example, includes an element substrate 34 and a semiconductor laminated part 33 provided on one primary surface of the element substrate 34. Also, flip chip mounting is clone such that the light emitting element 30 has a p side electrode 31 and an n side electrode 32 provided on the surface of the semiconductor laminated part 33 which is the same surface side, that p side electrode 31 is connected to the first projecting part 1a with an electrically conductive adhesive member 20 interposed, and the n side electrode 32 is connected to the second projecting part 2a with the electrically conductive adhesive member 20 interposed. Though shown in simplified form, in FIG. 2, the p side electrode 31 and the a side electrode 32 are electrically separated, the p side electrode 31 is in contact with a p type semiconductor layer of the semiconductor laminated part 33, and the n side electrode 32 is in contact with an n type semiconductor layer of the semiconductor laminated part 33. Also, in the light, emitting, element 30, the surface of the element substrate 34 of the reverse side to the surface on which, the p side electrode 31 and the n side electrode 32 are formed is the primary light emitting surface of the light emitting element 30. Also, the light emitting element 30 is a light emitting diode chip of a rectangle that is long in the X direction and short in the Y direction.

The light-transmissive member 50 is a member that can transmit light from the light emitting element 30, and configures the light emitting surface of the light emitting device 100. The light-transmissive member 50 may also include a wavelength conversion substance for converting light from the light emitting element 30 to a different wavelength. Also, the light-transmissive member 40 may also be a single layer or plurality of layers. For example, as the light-transmissive member 50, it is also possible to be a laminated structure of a first light-transmissive member 51 containing a wavelength conversion substance 51b in a parent material 51a comprising resin, and a second light-transmissive member 52 that essentially does not contain the wavelength conversion substance.

The sealing member 70 is a member for protecting the light emitting element 30, and is a light reflective resin member that contains a white pigment in the parent material comprising resin, for example. The sealing member 70 coats the side surface off the light emitting element 30 on the substrate. With the light emitting device 100 shown in FIG. 2, comprised are the light guide member 40 and the light-transmissive member 50, and the sealing member 70 coats the side surfaces of these. The sealing member 70 encloses along the entire circumference of the side surfaces of the light emitting element 30, the light-transmissive member 50, etc. Also, the top surface of the light-transmissive member 50 and the top surface of the sealing member 70 configure essentially the same surface.

Following, the Method for manufacturing a light emitting device of an embodiment is explained while referring to the drawings. The method for manufacturing a light emitting device of the embodiment is a method for manufacturing a light emitting device that divides into individual light emitting devices after a plurality of light emitting devices respectively including light emitting elements are formed in an aggregate state. In more detail, the method for manufacturing a light emitting device includes a substrate preparation step, a reinforcing member forming step, a mounting step, a light-transmissive member forming step, a sealing member forming step, and a cutting step.

Hereafter, each step is explained in detail.

Substrate Preparation Step

Figure 3A:
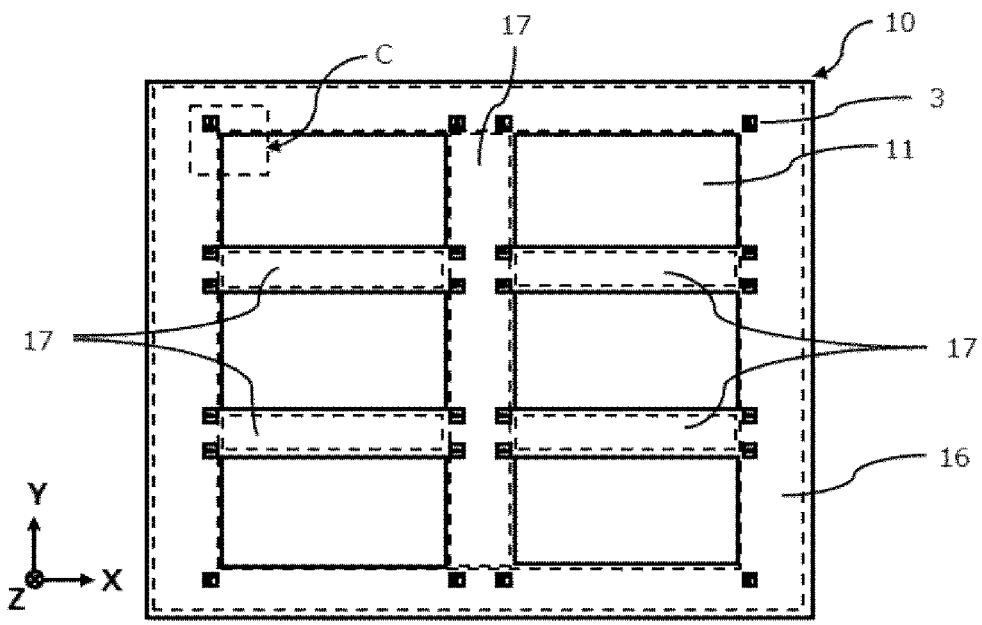
FIG. 3A is a schematic plan view showing a substrate 10 used with the method for manufacturing a light emitting device of an embodiment.
Figure 3B:
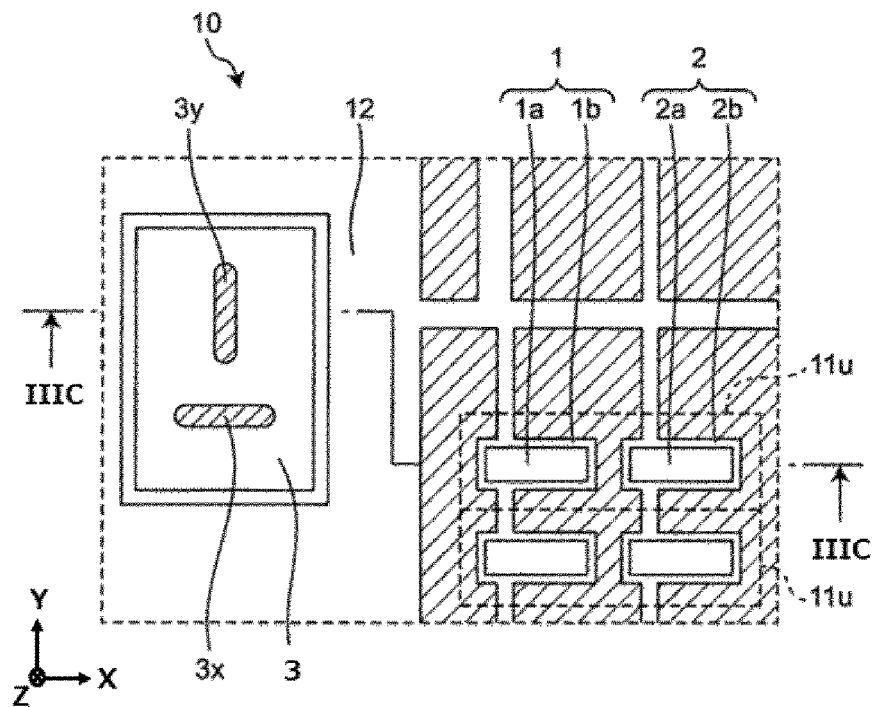
FIG. 3B is a schematic plan view showing an enlarged view of a region C of a portion of FIG. 3A.
Figure 3C:
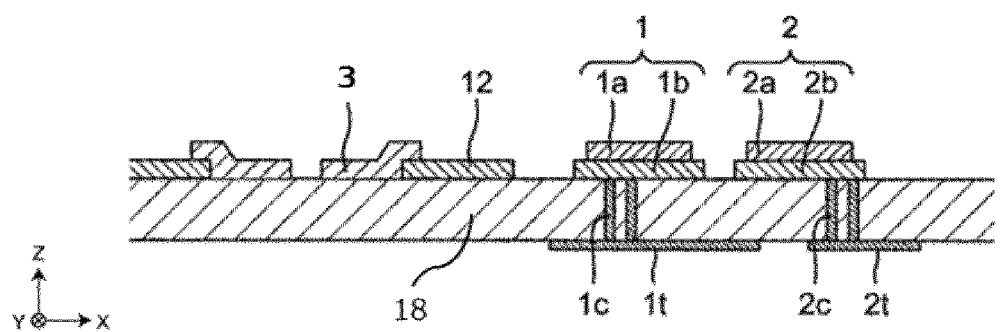
FIG. 3C is a schematic cross section view of line IIIC-IIIC in FIG. 3B.

The substrate preparation step is a step for preparing the substrate 10, comprising the base 18, and the electrical conductive member such as a wiring electrode 12, etc., on the top surface of that base 18. FIG. 3A is a schematic plan view showing the overall configuration of the substrate 10 used for the method for manufacturing the light emitting device of the embodiment. FIG. 3B is a partial enlarged view of FIG. 3A, and FIG. 3C is a schematic end view of line IIIC-IIIC in FIG. 3B.

The substrate 10 is a rectangle with a top view shape as shown in FIG. 3A, and comprises as first region 11, and a second region 16 surrounding the first region 11. The first region 11 is as region including a mounting region in which the light emitting element is mounted. The second region 16 is a region in which the light emitting element is not mounted, and is a region that is not included in the diced light emitting devices.

The substrate 10 shown in FIG. 3A comprises a plurality of the first regions 11, and here, an example is shown with six first regions 11. In this way, when at plurality of the first regions 11 are placed, the region surrounding all of the plurality of first regions 11 is the second region 16. Also, as shown in FIG. 3A, when a plurality of the first regions 11 are comprised in the region surrounded by the second region 16, the region between the first region 11 and the adjacent first region 11 is called a third region 17.

The plurality of first regions 11 are arrayed forming one or a plurality of rows and columns, for example. In this specification, items arrayed in the X direction are called columns, and items arrayed in the Y direction are called rows. With the example shown in FIG. 3A, the first regions 11 are placed in 3 rows and 2 columns. Also, each of the respective first regions 11 include a plurality of unit mounting regions 11u provided corresponding to one light emitting device 100. With the example shown in FIG. 3A, one unit mounting region 11u is illustrated as a horizontally long rectangle, and a plurality of rows and columns are arrayed for each first region 11. For example, it is possible to comprise 40 rows×24 columns of the unit mounting regions 11u in one first region 11.

On the respective unit mounting regions 11u of the substrate 10, as shown in FIG. 3B, the first land electrode 1 and the second land electrode 2 are provided. Also, the first land electrode 1 and the second land electrode 2 respectively include the first lower electrode 1b, the first projecting part to provided on the first lower electrode 1b, the second lower electrode 2b, and the second projecting part 2a provided on the second lower electrode 2b of the kind shown in FIG. 3C. Also, the first terminal electrode 1t and the second terminal electrode 2t are respectively provided on the bottom surface of the substrate 10 in the unit mounting region 11u. In each unit mounting region 11u, the first kind electrode 1 and the second land electrode 2 are respectively connected to the first terminal electrode it and the second terminal electrode 2t by connection electrodes 1c, 2c formed on the side surface of the through holes provided on the substrate 10. The first land electrode 1 and the second land electrode 2 are provided as a portion of the wiring electrode 12 on the substrate 10 as shown in FIG. 3B. FIG. 3B is a plan view showing, a portion of the top surface of the substrate 10, and is not a cross section view, but so as to easily understand the shape of the wiring electrode 12 formed continuously, the surface of the substrate 10 is shown marked by cross hatching on the exposed part. In FIG. 3B, the part that does not have cross hatching is the wiring electrode 12.

The substrate 10 preferably comprises an alignment mark 3 used mainly in the cutting step. For the alignment mark 3, as shown in FIG. 3B, for example, it is, possible to use an item that combines two alignment marks 3x, 3y. The alignment mark 3x is formed so that the long direction matches the X direction, and the alignment mark 3y is formed so that the long direction matches the Y direction. In specific terms, for example, the alignment mark 3x is a shape that is long in the X direction, having a long side extending and facing in the X direction, and a semicircular shaped end side connecting the respective end parts of that long side. Also, the alignment mark 3y is a long shape that is long in the V direction, and has a long side extending and hung in the Y direction, and a semicircular shaped end side that connects the respective end parts of that long side. The alignment marks 3 (3x, 3y), as shown in FIG. 3A, for example, has either one or both placed inside the second region 16 near the outside corner of each first region 11.

As the substrate 10, it is possible to use a material such as the following. The base 18 which is the parent material of the substrate 10 preferably has a linear expansion coefficient, for example, of approximately 20 ppm/° C. or less, more preferably approximately 10 ppm/° C. or less, and even more preferably approximately 8 ppm/° C. or less, approximately 7 ppm/° C. or less, approximately 6 ppm/° C. or less, approximately 5 ppm/° C. or less, approximately 4 ppm/° C. or less, approximately 3.5 ppm/° C. or less. As a specific material for the base 18, it is possible to use epoxy resin, bismaleimide, triazine (BT) resin, polyimide resin, cyanate resin, polyvinyl acetal resin, phenoxy resin, acrylic resin, alkyd resin, urethane resin, etc. The thickness of the base 18, though it depends on the used material, the type and structure of the mounted light emitting element, etc., for example, approximately 470 μm or less is preferable, and approximately 370 μm or less, approximately 320 μm or less, and approximately 270 μm, 200 μm, 150 μm, 100 μm or less are even more preferable. Also, when considering strength, etc., it is preferable that the thickness of the base 18 be approximately 20 μm or greater. The size of the base 18 can be, for example, a rectangle for which one side is 90 mm to 60 mm. The size of the first region 11 can be, for example, a rectangle for which one side is 36 mm to 14 mm. For the second region 16, the width of the frame surrounding the first region 11 can be 75 mm to 90 mm. For the third region 17, the width can be 50 mm to 78 mm.

Reinforcing Member Forming Step

Figure 5A:
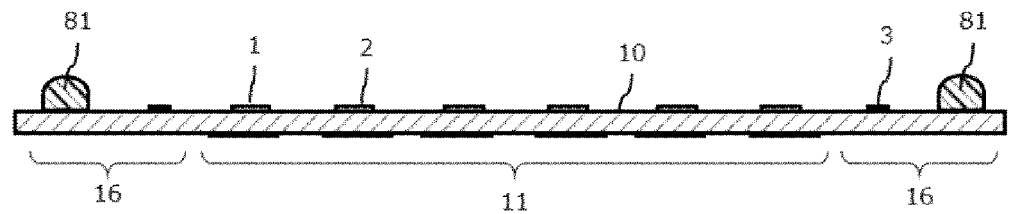
FIG. 5A is a schematic cross section view showing the method for manufacturing a light emitting device of an embodiment.

The reinforcing member forming step is a step of forming a reinforcing member that is a liquid resin material by applying, etc., on the second region 16 surrounding the first region 11 on the substrate 10, and then hardening. FIG. 5A is a schematic cross section view showing an example of the state with the reinforcing member formed on the substrate 10 shown in FIG. 3A. FIG. 5A shows an example of the substrate 10 with the third region omitted, comprising the first region 11 with three pairs of the first land electrode and the second land electrode 2 placed, and the second region 16 placed outside of that. Furthermore, in FIG. 5A to 5H, the illustration is simplified, showing only the first land electrode 1, without differentiating between the first lower electrode 1b and the first projecting part 1a. Similarly, the illustration is simplified, showing only the second land electrode 2, without differentiating between the second lower electrode 2b and the second projecting part 2a. Also, in FIG. 5A to FIG. 5H, the electrically conductive adhesive member 20 is not shown.

With the example shown in FIG. 3A, a plurality of the first regions 11 are placed in the region surrounded by the second region 16, and there are the third regions 17 between adjacent first regions 11. As the reinforcing member, the reinforcing member formed in the second region 16 is also called the first reinforcing member. Also, the reinforcing member formed in the third region 17 is also called the second reinforcing member.

First, as the material of the reinforcing member, a liquid resin material is prepared. The resin material, for example, is a material for which a filler, nano filler, etc., is added to silicone resin, and the filler, etc., is mixed uniformly by stirring. Thereafter, for example, it is possible to implement defoaming processing using a centrifugal stirring defoaming device. By doing this, it is possible to have the resin material be without bubbles. Next, the prepared resin material is formed by applying, etc., on the second region or the third region on the substrate 10. As the reinforcing member forming method, an example includes a method of applying that draws while discharging from a nozzle of a dispenser. It is also possible to print using a mask, etc. Alternatively, it is also possible to use a method of spraying using a spray.

When forming the reinforcing member by coating using a dispenser, the viscosity of the reinforcing member filled inside a syringe before hardening can be approximately 1 Pa·s to 50 Pa·s, for example. The width of the reinforcing member can be adjusted using the syringe moving speed or the pressure applied to the syringe. For example, the syringe moving speed can be 0.1 mm/s to 5 mm/s, and the pressure applied to the syringe can be 0.01 MPa to 0.3 MPa.

When forming the reinforcing member using printing, the viscosity of the reinforcing member before hardening can be approximately 50 Pa·s to 200 Pa·s. The width of the reinforcing member can be adjusted by the punch process width of the specified metal mask.

When spraying using a spray, the viscosity of the reinforcing member filled inside the syringe before hardening can be 1 Pa·s to 100 mPa·s, for example. The width of the reinforcing member can be adjusted by the moving speed of the spray nozzle, the distance between the spray nozzle and the substrate, and the pressure applied to the syringe. For example, it is possible to have the spray nozzle moving speed be 0.1 mm/s to 5 mm/s, the distance between the spray nozzle and the substrate be 1 mm to 10 mm, and the pressure applied to the syringe be 0.01 MPa to 0.5 MPa.

As the hardening method for the reinforcing member, examples include heating in an oven, ultraviolet irradiation, etc. When doing heat hardening, as the hardening temperature, though it depends on the material of the reinforcing member, the thickness of the reinforcing member, etc., it is possible to use 80° C. to 150° C. for example. Also, the heating time can be approximately 1 to 8 hours. The atmosphere within the oven can be nitrogen, air, etc.

Also, after heat hardening, it is possible to do natural cooling or forced cooling. During heating and during cooling, for the substrate 10, it is preferable to fix a material that is not easily affected by warping due to heat, etc., using tape or a clamp on a flat plate of stainless steel, aluminum, etc. The linear expansion coefficient of the reinforcing member after hardening is preferably the same as the linear expansion coefficient of the substrate. For example, approximately 10 ppm/° C. or less is preferable, and approximately 4 ppm/° C. or less is more preferable. By doing this, it is possible to reduce warping due to expansion or contraction of the substrate 10 or the sealing member 70 due to temperature change.

Preferably, the reinforcing member is formed to be preferably at least 60% or greater than the length of at least one first region 11 in the X direction or the Y direction, and more preferably, is formed at a length of at least 100% or greater than the length of one first region 11.

Also, the height of the reinforcing member is preferably formed to be lower than the sealing member 70 formed in a step described later. For example, it is preferable to have a height of 10 μm to 300 μm. The shape in the cross section view of the reinforcing member can be, as shown in FIG. 5A, for example, a shape for which the top surface is a convex surface and the side surface is approximately vertical. The invention is not limited to this, and the shape in the cross section view of the reinforcing member can also be a shape such as a semicircular shape, a semi-elliptical shape, a parabolic surface, etc., or a shape for which the top surface is a concave surface, a shape for which the top surface is a flat rectangle, trapezoid, etc. Also, the thickness of the reinforcing member may also be thicker than the substrate 10. In this case, the effect of the substrate reinforcement is greater than that of the reinforcing material that is thinner than the substrate 10, and works more effectively with respect to substrate warping.

Also, the width of the reinforcing member (after hardening) can be 1 mm to 5 mm, for example. When the alignment mark 3 is formed on the second region 16, the forming position is adjusted so that the alignment mark 3 is not covered by the reinforcing member. When forming a light-transmissive resin 80 for protecting the alignment mark 3 described later, the reinforcing member is formed at a position so that the light-transmissive resin 80 can be formed. Also, the reinforcing member is formed so as to be held within the outer circumference end part of the substrate 10.

Also, the reinforcing member is preferably formed at a closer position to the first region 11, and for example, it is preferable that the distance from the end part of the first region 11 to the end part of the reinforcing member be 8 mm or less. Also, the reinforcing member is preferably formed at a position that has line symmetry on the top surface of the substrate 10. By doing this, it is possible to efficiently suppress warping of the substrate 10, and to have the substrate 10 have a high level of flatness.

As the reinforcing member of various shapes shown by example above, it is possible to use either a thermosetting resin or an ultraviolet curing resin. For example, it is possible to use silicone resin, modified silicone resin, hybrid silicone resin, epoxy resin, or a material containing two or more of these. In particular, it is preferable to use silicone modified resin. Also, for the reinforcing member, it is also possible to contain a filler, etc. in these resins. For example, it is possible to add as appropriate one or a combination of a plurality of a linear filler, a spherical filler, and a nano size filler (nano filler). By doing this, it is possible to adjust the viscosity, or to adjust the thixotropy ratio. By doing this, it is possible to make it easier to form the reinforcing member at a designated width and a designated thickness.

As the linear filler, it is preferable to use aluminoborosilicate glass. The particle size of the linear filler preferably has a line length of 5 μm to 60 μm and more preferably 10 μm to 30 μm, and a line diameter that is preferably 3 μm to 20 μm, and more preferably 5 μm to 15 μm. As the spherical filler, alumina, titania, and silica are preferable. As the particle size of the spherical filler, the average particle diameter is 20 μm to 80 μm, and more preferably 30 μm to 70 μm. As the nano filler, nano particles of silica is preferable. For the reinforcing member, the hardness alter hardening is preferably approximately Shore D30 to Shore E70. As the linear expansion coefficient of the reinforcing member, it is preferable to be approximately equivalent to that of the substrate. The blending quality of the filler contained in the reinforcing member is 1 weight % or greater to 80 weight % or less.

FIG. 4A to FIG. 4G are schematic plan views respectively showing examples of modified examples of a state with the reinforcing member formed on the substrate 10 shown in FIG. 3A. It is also possible to use these shapes in a combined shape, etc.

Figure 4A:
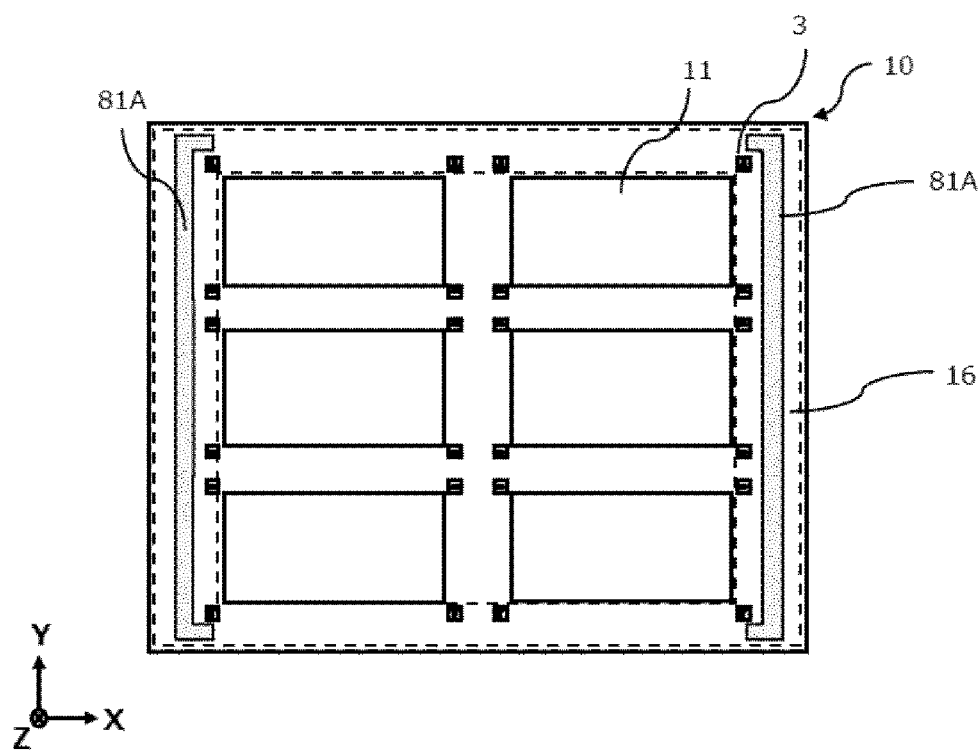
FIG. 4A is a schematic plan view showing the method for manufacturing a light emitting device of an embodiment.

With the example shown in FIG. 4A, in the square frame, shaped second region 16 in the outer circumference region of the substrate 10, comprised are two first reinforcing members 81A formed in two regions stretching in the Y direction, Each first reinforcing member 81A is formed continuously spanning the length of three first regions 11. The two first reinforcing members 81A are preferably formed with the same length and the same thickness. By doing this, it is possible to efficiently suppress warping of the substrate 10.

Furthermore each first reinforcing member 81A is formed further to the outside than the alignment mark 3 so as not to overlap the alignment mark 3. By doing this, it is possible to recognize the alignment mark 3 in the cutting step, and possible to do dicing with high precision. Also, with the first reinforcing member 81A, the top end and bottom end in the Y direction comprise a portion extending facing inside (X direction). By doing this, it is possible to have less susceptibility for the top end and bottom end of the first reinforcing member 81A to peel from the substrate 10.

Figure 4B:
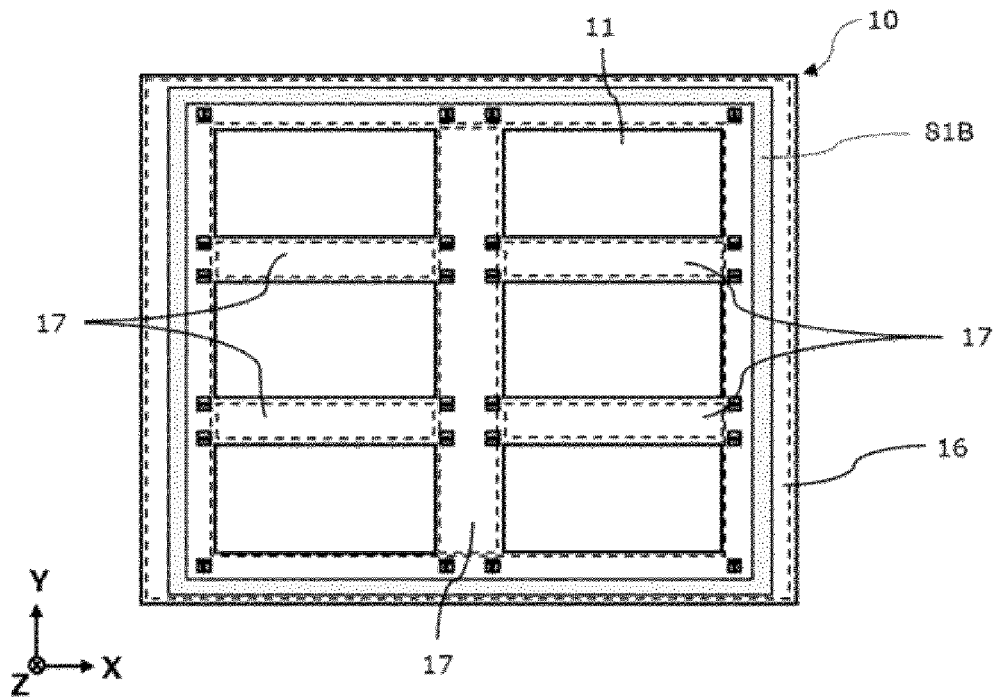
FIG. 4B is a schematic plan view showing the method for manufacturing a light emitting device of an embodiment.

With the example shown in FIG. 4B, one frame shaped first reinforcing member 81B is placed in the frame shaped second region 16. In this way, by comprising the frame shaped first reinforcing member 81B continuously with the periphery of the first region 11, it is possible to suppress warping of the substrate.

Figure 4C:
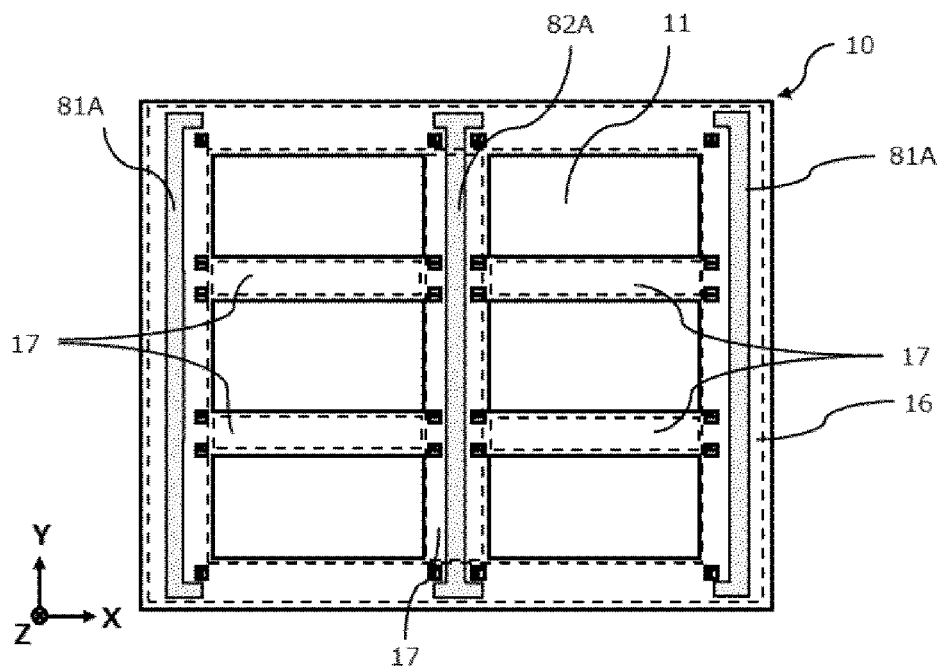
FIG. 4C is a schematic plan view showing the method for manufacturing a light emitting device of an embodiment.

With the example shown in FIG. 4C, in addition to the two first reinforcing members 81A shown by example in FIG. 4A, one second reinforcing member 82A is comprised separated from the first reinforcing member 81A in the third region 17 between the first regions 11 placed in the X direction. The second reinforcing member 82A, the same as with the first reinforcing member 81A, is formed continuously spanning the length of three first regions 11, stretching in the Y direction. The top end and bottom end in the Y direction of the second reinforcing member 82A comprise a portion extending facing the lateral direction (X direction). By doing this, it is possible to have less susceptibility for the top end and bottom end in the Y direction of the second reinforcing member 82A to peel from the substrate 10. The top end and bottom end in the Y direction of the second reinforcing member 82A are formed extending to the first region 16, so that portion can also be called the first reinforcing member. The second reinforcing member 82A can have the same width or a different width from the width (thickness) of the first reinforcing member 81A. In addition to the first reinforcing member 81A, by comprising the second reinforcing member 82A, it is possible to effectively suppress warping of the substrate.

Figure 4D:
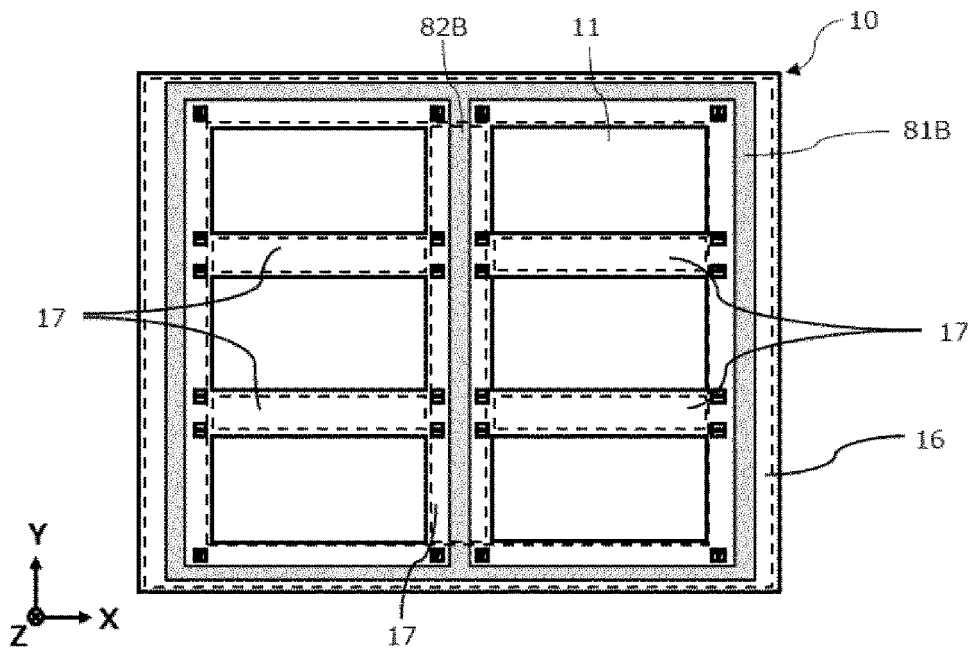
FIG. 4D is a schematic plan view showing the method for manufacturing a light emitting device of an embodiment.

With the example shown in FIG. 4D, comprised are the first reinforcing member 81B formed in a frame shape (ring shape) spanning the entire second region 17 and the second reinforcing member 82B continuous (connected) with this first reinforcing member 81B. The second reinforcing member 82B stretches in the Y direction, and the top end and bottom end respectively connect with the first reinforcing member 81B. By forming the reinforcing members in this kind of region, it is possible to suppress warping of the substrate 10 in both the X direction and the Y direction.

Figure 4E:
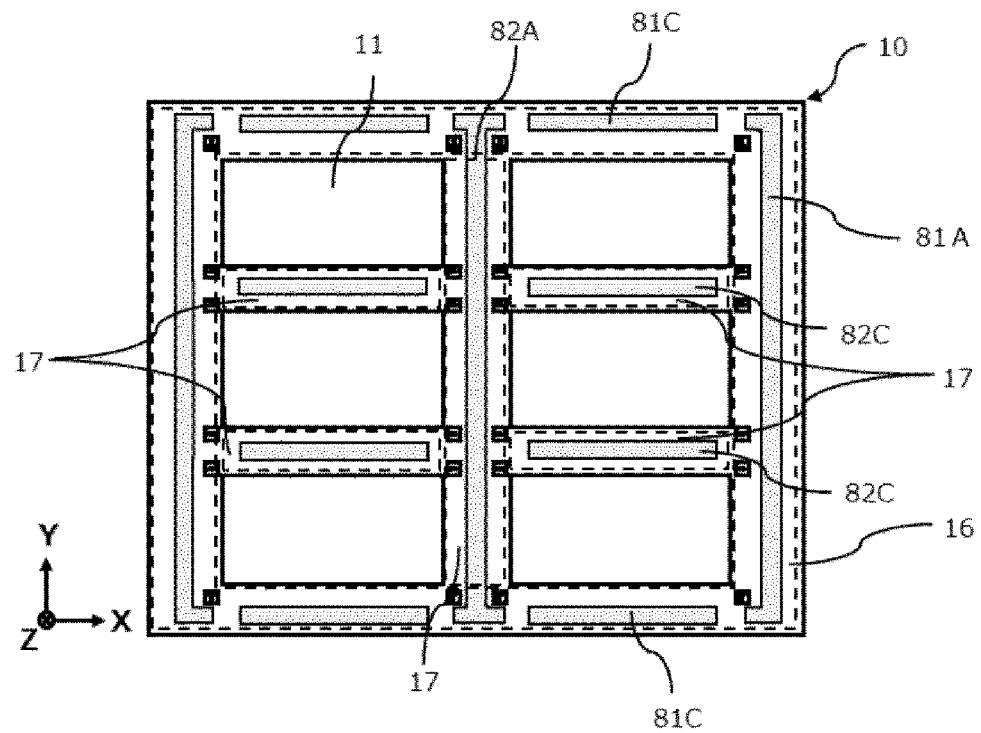
FIG. 4E is a schematic plan view showing the method for manufacturing a light emitting device of an embodiment.

In FIG. 4E, in addition to the first reinforcing member 81A and the second reinforcing member 82A shown by example in FIG. 4C, comprised is a first reinforcing member 81C in the second region 16 placed at the top side and the bottom side in the Y direction of the substrate 10. By having the first reinforcing members 81A, 81C and a portion of the second reinforcing member 81A formed in the first region 16 be respectively formed separately, in addition to reducing warping of the substrate 10, when forming the sealing resin 80, it is possible to ensure a shared passage for the resin material of the sealing resin 70, and to do molding easily.

Furthermore, a second reinforcing member 82C is comprised respectively in the third regions 17 between the first regions 11 placed in the Y direction. The four second reinforcing members 82C formed in the third regions 17 are separated from the reinforcing member 81A, and also separated from the second reinforcing member 82A. Then, with each of the second reinforcing members 82C, the length in the X direction is shorter than the first region 11. By forming the second reinforcing members 82C with such a length, it is possible to make molding of the sealing resin 70 easy. The first reinforcing member 81C is preferably the same width as the first reinforcing member 81A. Also, the second reinforcing members 82C preferably have the same width as the second reinforcing member 82A.

Figure 4F:
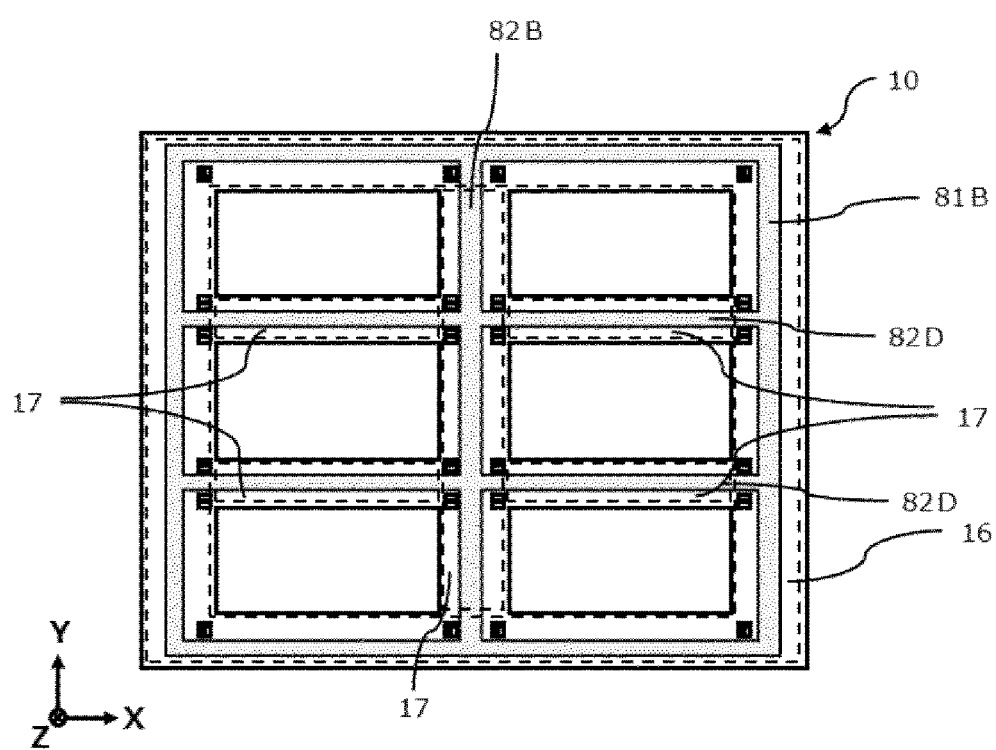
FIG. 4F is a schematic plan view showing the method for manufacturing a light emitting device of an embodiment.

With the example shown in FIG. 4F, in addition to the ring shaped first reinforcing member 81B, and the second reinforcing member 82B that connects with the first reinforcing member 81B stretching in the V direction shown in FIG. 4D, a second reinforcing member 8D that stretches in the X direction is comprised. In this way, in all the first regions 11, by forming the reinforcing member surrounding in a ring shape spanning the entire circumference, it is possible to more firmly suppress warping. The second reinforcing members 82D preferably have the same width as the second reinforcing member 82B.

Figure 4G:
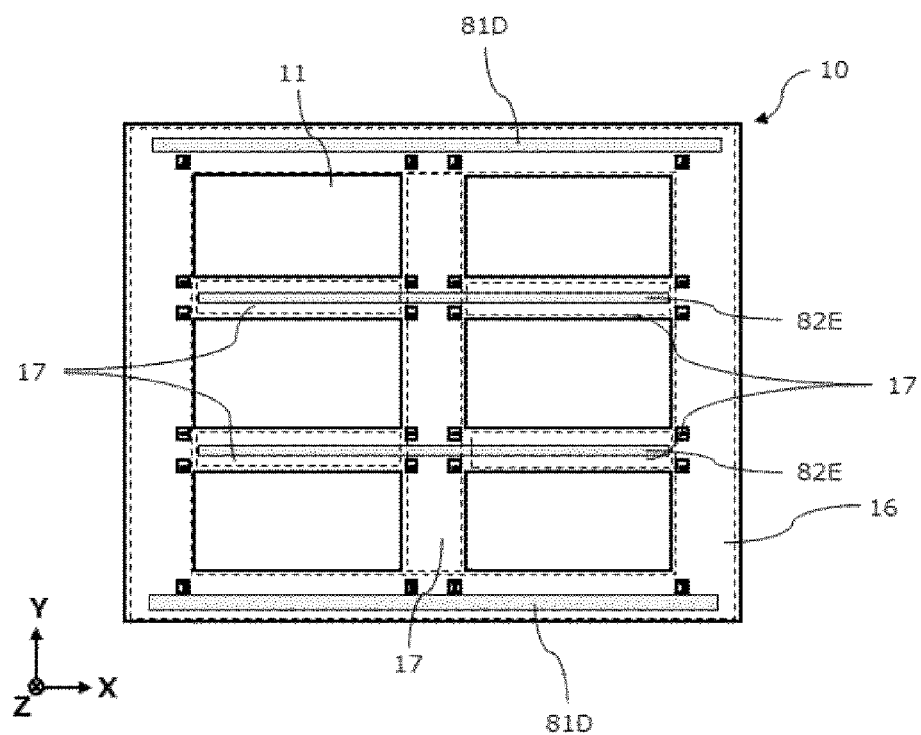
FIG. 4G is a schematic plan view showing the method for manufacturing a light emitting device of an embodiment.

With the example shown in FIG. 4G, comprised are two first reinforcing members 81D stretching in the X direction, and two second reinforcing members 82E stretching in the X direction. The two first reinforcing members 81D are longer than the length spanning the two first regions 11. The two second reinforcing members 82E have approximately the same length as the length spanning two first regions 11, and a length shorter than that of the first reinforcing members 81D. Furthermore, the first reinforcing members 81D have a smaller width than that of the second reinforcing members 82E. By doing this, it is possible to effectively suppress warping particularly of the substrate for which warping is strong in the lengthwise direction.

Mounting Step

Figure 5B:
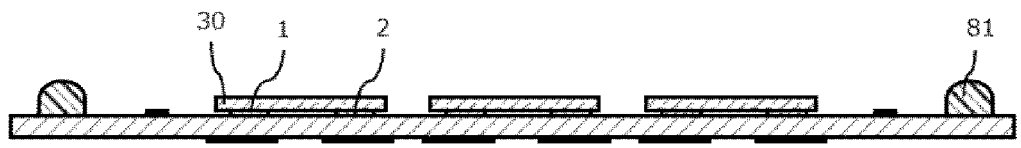
FIG. 5B is a schematic cross section view showing the method for manufacturing a light emitting device of an embodiment.

The mounting step is a step for mounting the light emitting element 30 on a designated position of the respective first region 11 on the substrate 10. As shown in FIG. 5B, with the mounting step, one light emitting element 30 is flip chip mounted on a first land 1 and a second land 2 placed on the first region 11 on the substrate 10. In more detail, first, the meltable electrically conductive adhesive member 20 is placed on a first projecting part 1a and a second projecting part 2a shown in FIG. 3C. As the electrically conductive adhesive member 20, for example, a eutectic solder such as PbSn, etc., or an AuSn alloy, etc., is used. As a specific material of the AuSn alloy, examples include the AuSn alloy, an SnAgCu alloy, etc. The AuSn alloy can be formed in a ball shape or a hemisphere shape. Also, with the electrically conductive adhesive member, when formed in a ball shape (in the case of the AuSn alloy), to stabilize the orientation of the light emitting element mounted on top of that, it is also possible to place a temporary fixing material on the AuSn alloy ball. As the temporary fixing material, it is preferable to use a member that is volatilized by heating, and an example includes a high boiling point solvent, etc. When the AuSn alloy is not in a ball shape, for example, in the case of an electrically conductive adhesive member with a flat top surface, it is possible to omit placing of the temporary fixing material.

Next, the light emitting element 30 is mounted on the substrate 10 so as to have the p side electrode 31 and the n side electrode 32 of the light emitting element 30 (see FIG. 2) respectively oppose the first projecting part 1a and the second projecting part 2a. Also, the substrate 10 on which the light emitting element 30 is mounted is placed inside a heating device such as a reflow oven, etc., and after melting of the electrically conductive adhesive member by heating, this is cooled to harden. The heating temperature is a higher temperature than the melting point of the electrically conductive adhesive member, and for example can be approximately 290 to 330° C. When this heat, melting is done, by a self alignment effect by the first projecting part 1a and the second projecting part 2a, the light emitting element 30 is mounted with high position precision with respect to the first projecting part 1a and the second projecting part 2a. Even after going through this hind of heating step, and cooling step, the reinforcing member is comprised on the substrate 10, so warping of the substrate 10 is reduced.

Light-transmissive Member Placing Step

Figure 5C:
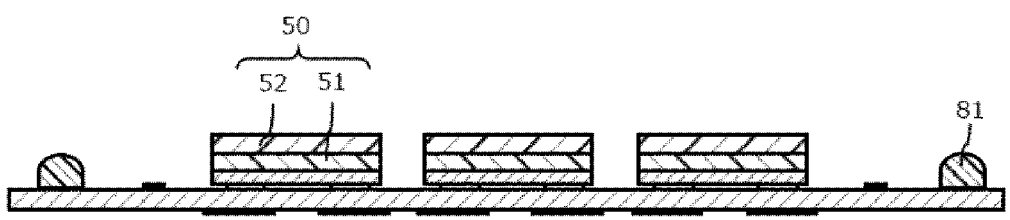
FIG. 5C is a schematic cross section view showing the method for manufacturing a light emitting device of an embodiment.

As shown in FIG. 5C, the light-transmissive member placing step is a step for placing the light-transmissive members 50 respectively on the light emitting elements 30. Here, as the method for placing the light-transmissive members 50 an example is shown of a method of the light-transmissive members 50 that were molded in advance being mounted on the light emitting elements 30. In this case, the liquid light guide member 40 that will be the adhesive agent is coated on the light emitting elements 30, the light-transmissive members 50 are mounted on that, and hardening of the light guide member 40 is done by heat processing. For the light guide member 40, examples include a method of transfer using a pin, a method of potting using a dispenser, etc. The "liquid" in this specification includes a sol state and slurry state. When mounting this kind of light-transmissive member, warping of the substrate is suppressed by having a reinforcing member. By doing this, it is possible to ensure mounting precision of the light transmissive member.

The light-transmissive member 50 that was molded in advance is a small piece of a rectangular solid that is long in the X direction and short in the Y direction, and for example, can be one size larger than the light emitting element 30. The small piece of the light-transmissive member 50 can be obtained, for example, by cutting a large size light-transmissive member, then this small piece of light-transmissive member can be suctioned using a collet, etc., and picked up, and after mounting on the adhesive agent (light, guide member) on the light emitting surface of the light emitting element 30, joining is done by hardening the adhesive agent. Examples of the hardening method include heating or ultraviolet irradiation.

The light-transmissive member 50 can also comprise a single layer or a plurality of layers. For example, it is possible to have the light-transmissive member be a laminated structure for which two or more of a layer including the wavelength conversion substance, and a layer that essentially does not contain the wavelength conversion substance are laminated.

When the light-transmissive member is a laminated structure, it is preferable that the upper side be a layer that essentially does not contain the wavelength conversion substance. By doing this, for example, in the sealing member forming step described later, when removing the sealing member on the light-transmissive member 50 using grinding, etc., it is possible to remove the sealing member without grinding up to the layer that contains the wavelength conversion substance 51b. By doing this, it is possible to have little variation of the amount of the wavelength conversion substance 51b that exists on the light emitting element 30, and to have little variation of the light emitting color of the light emitting device. When containing the wavelength conversion substance 51b, it is possible to mix the wavelength conversion substance of for example 80 weight % to 120 weight % with respect to the resin which is the parent material.

As the wavelength conversion substance, as the green light emitting phosphor, examples include yttrium-aluminum-garnet based phosphor (e.g. $Y_3(Al, Ga)_5O_{12}$:Ce), lutetium-aluminum-garnet based phosphor (e.g. $Lu_3(Al, Ga)_5O_{12}$:Ce), terbium-aluminum-garnet based phosphor (e.g. $Tb_3(Al, Ga)_5O_{12}$:Ce), silicate based phosphor (e.g. $(Ba, Sr)_2SiO_4$:Eu), chlorosilicate based phosphor (e.g. $Ca_8Mg(SiO_4)_4Cl_2$:Eu), β sialon based phosphor (e.g. $Si_{6-z}Al_zO_zN_{8-z}$:Eu (0<z<4.2)), SGS based phosphor (e.g. $SrGa_2S_4$:Eu), etc. As the yellow light emitting phosphor, examples include α sialon based phosphor (e.g. $Mz(Si, Al)_{12}(O,N)_{16}$ (where 0<z≤2, and M is a lanthanide element excluding Li, Mg, Ca, Y, and La and Ce)). In addition, there are also yellow light emitting phosphors among the aforementioned green light emitting phosphors. Also, for example, with the yttrium-aluminum-garnet based phosphors, by substituting a portion of Y with Gd, it is possible to shift the light emission peak wavelength to the longer wavelength side, and possible to emit yellow light. Also, among these, there are also phosphors that can emit orange light.

Examples of the red light emitting phosphors include nitrogen-containing calcium aluminosilicate (CASN or SCASN) based phosphor (e.g. $(Sr, Ca)AlSiN_3$:Eu), etc. In addition, examples include phosphors represented by manganese activated fluoride based phosphors (phosphors represented by the general formula (1) $A_2[M_{1-a}Mn_aF_6]$ (where in the aforementioned general formula (1), A is at least one type selected from a group comprising K, Li, Na, Rb, Cs, and M is one type of element selected from a group comprising group 4 elements and group 14 elements, and a satisfies 0<a<0.2)). As a representative example of this manganese activated fluoride based phosphor, there is a manganese activated potassium fluorosilicate phosphor (e.g. $K_2SiF_6$:Mn).

After the light-transmissive members 50 molded in advance are respectively adhered on the light emitting elements 30, it is also possible to include a machining step for adjusting the outline of the light-transmissive members 50 to a designated size. This machining process is preferably, for example, grinding, the side surface of the light-transmissive member 50 by doing dry grinding without spraying water, using a dicer. By using dry grinding, it is possible to prevent the change in color of the wavelength conversion substance due to moisture. Also, with this machining step, it is possible to implement positioning of the blade for grinding with good precision using the alignment marks 3x, 3y. Also, for rinsing of the shavings after machining, for example, by rinsing using dry ice, it is possible to prevent the change of color of the wavelength conversion substance due to moisture.

Also, the light-transmissive members 50 can be formed using a method of placing the liquid light-transmissive members 50 on the light emitting elements 30 by dropping or spraying, etc., and then hardening. With this kind of method, it is also possible to form the light-transmissive members 50 after forming the sealing member 70.

Alignment Mark Coating Step

The alignment mark coating step is a step for covering the alignment mark with the light-transmissive resin 80. It is also possible to omit this step.

Figure 5D:
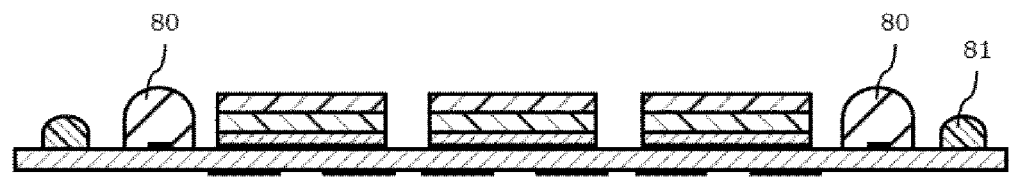
FIG. 5D is a schematic cross section view showing the method for manufacturing a light emitting device of an embodiment.

Here, as shown in FIG. 5D, for example, the alignment mark 3 is coated using the light-transmissive resin 80. For the light-transmissive resin 80, for example, it is possible to use silicone resin, silicone modified resin, epoxy resin, phenol resin, polycarbonate resin, acrylic resin, trimethylpentene resin, or polynorbomene resin, or a material containing two or more of these, and among these, it is preferable to use silicone resin. Also, with the alignment mark coating step, to form the light-transmissive resin 80 at a designated width and a designated thickness, it is preferable to add a nano size filler to the light-transmissive resin 80 to adjust viscosity and do application. After adding the nano filler to the light-transmissive resin 80, for example, using a centrifugal stirring defoaming device, it is preferable to make this so as not to contain bubbles, and in a state with translucency maintained, to do application on the alignment mark 3.

Sealing Member Forming Step

The sealing member forming step is a step for covering the first region 11 and the second region 16 of the substrate 10 with the sealing member 70 containing a reflective resin material that reflects light of the light emitting element 30. At this time, the sealing member 70 is formed at the height at which the top surface of the light-transmissive member 50 is coated on the light emitting element 30. Furthermore, the reinforcing member placed on the second region 16 is also coated by the sealing member 70. Also, when the light-transmissive resin 80 described above is comprised, this is formed around the periphery of the light emitting element 30 so that at least a portion of the surface of the light-transmissive resin 80 is exposed. Also, though not illustrated, when the substrate 10 comprises the third region 17, it is also possible to coat the third region 17 integrally with the first region 11 and the second region 16 by the sealing member 70. Alternatively, a portion or all of the third region 17 can also be coated by the sealing member 70. At that time, a portion or all of the second reinforcing member can also be coated by the sealing member 70.

This sealing member forming step can include, for example, (a) a step A for forming the sealing member 70 to cover the light emitting elements 30 and the light-transmissive members 50, and then hardening the sealing member 70, and (b) a step B for removing the hardened sealing member 70 so as to expose the surface of the light-transmissive members 50. Following, a case including step A and step 13 is explained.

1. Step A (Sealing Member Forming Step)

Figure 5E:
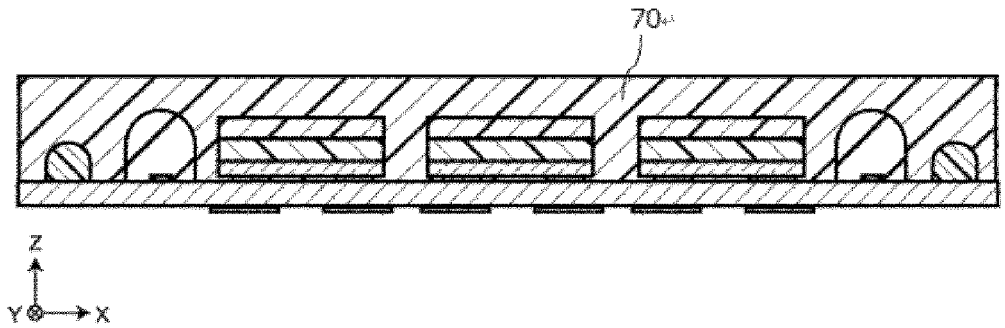
FIG. 5E is a schematic cross section view showing the method for manufacturing a light emitting device of an embodiment.

As shown in FIG. 5E, with step A, for example, the sealing member 70 is formed tin the first region 11 and the second region 16 on the substrate 10. In more detail, the liquid sealing member 70 is placed so as to cover the light emitting element 30, etc., of the first region 11, and the reinforcing member of the second region 16. As the method for placing the sealing member 70, for example, it is possible to use a method such as transfer molding, compression molding, potting, printing, etc.

For example, in the case of compression molding, after stirring the liquid sealing member 70 using, a stirring device, this is filled in a syringe using a centrifugal defoaming filling machine. Next, the liquid sealing member 70 filled in the syringe is supplied onto the substrate 10 on which are placed the light emitting elements 30 and the light-transmissive members 50 etc., set on a metal mold or a compression molding machine. After that, the substrate, etc., is sandwiched by an upper and lower metal mold, and the sealing member undergoes compression hardening. In the case of compression molding, the thickness of the sealing member is determined by the amount of sealing member that is supplied. In the case of transfer molding, the substrate is mounted inside the metal mold, and the liquid sealing member filled inside the syringe is supplied to the plunger inside the metal mold. After that, by lowering the tipper metal mold to sandwich the substrate, sealing resin is pressed in and supplied by the plunger in the gap made between the metal mold and the substrate, and this is hardened. In the case of transfer molding, the thickness of the sealing member is determined by the shape of the metal mold.

As the sealing member 70, it is possible to use a resin material containing a resin that is the parent material, and a light reflecting material. The sealing member 70 preferably is, a material for which the linear expansion coefficient after hardening is as close as possible to that of the substrate 10. For example, it is preferable to be approximately ±100 ppm/° C. with respect to the linear expansion coefficient of the substrate 10. Also, the linear expansion coefficient of the sealing member 70, for example, is preferably approximately 120 ppm/° C. or less, and more preferably approximately 110 ppm/° C. or less. As a specific material of the resin, it is possible to use epoxy resin, silicone resin, etc. As a specific light reflecting material, examples include titanium oxide, silicon oxide, calcium carbonate, aluminum oxide, etc. As the content amount of the light reflection material, it is possible to be 10 weight % to 70 weight % with respect to the resin.

2. Step B (Sealing Member Removing Step)

Figure 5F:
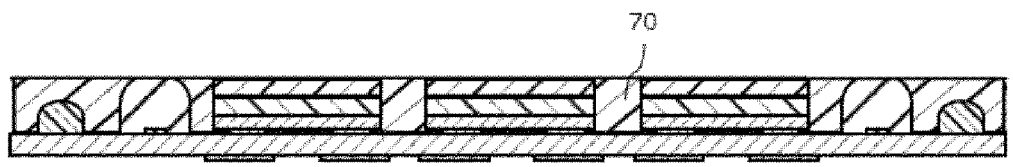
FIG. 5F is a schematic cross section view showing the method for manufacturing a light emitting device of an embodiment.

With step B, the sealing member 70 above the light-transmissive members 50 is removed to expose the light-transmissive members 50. In specific terms, as shown in FIG. 5F, the sealing member 70 is removed using grinding or blasting, etc., from the top surface until the top surface of the light-transmissive member 50 (light emitting surface of the light emitting device) is exposed. When the light-transmissive resin 80 is comprised, the sealing member 70 is removed until the top surface is exposed. When removing the sealing member 70, it is also possible to remove a portion of the light-transmissive member 50 simultaneously. In such a case, a different surface from the original top surface of the light-transmissive member 50 becomes the light emitting surface of the light emitting device.

Due to a difference in the linear expansion coefficient of the sealing member 70 and the substrate 10, then the liquid sealing member 70 is hardening, or after hardening, there are cases when the substrate 10 and the sealing member 70 warp. With this embodiment, by comprising the reinforcing member, it is possible to suppress warping of the substrate 10 and the sealing member 70 before hardening or after hardening of the sealing member 70.

By working as described above, the sealing member 70 is formed covering the side surface of the light emitting element 30 and the side surface of the light-transmissive member. This step is a step of exposing the light-transmissive member 50 which becomes the light extraction surface, and also of determining the height of the light emitting device 100. With the manufacturing method of this embodiment, by comprising the reinforcing member, it is possible to suppress warping of the substrate 10 and the sealing member 70. For that reason, it is possible to have the removal amount of the sealing member 70 be constant, so it is possible to have the light emitting device 100 have variation in height suppressed.

With the explanation above, an example as shown of removing the sealing member 70 so as to simultaneously expose the top surface of the light-transmissive resin 80 and the light emitting surface of the light emitting device, but it is also possible to expose the light-transmissive resin 80 and the light-transmissive member 50 using separate steps.

Also, in step A described above, when forming the sealing member so that at least a portion of the top surface of the light-transmissive member is exposed, it is possible to omit step B. In this kind of case as well, by comprising the reinforcing member warping of the substrate 10 is reduced, so it is possible to make the thickness of the light-transmissive member, etc., uniform.

It is also possible to form the light-transmissive member 50 using a potting method or spray method. In this case, after forming the sealing member 70 so that the top surface of the light emitting element 30 is exposed, or after terming the sealing member 70 with the top surface of the light emitting element 30 buried, after exposing the top surface of the light emitting element 30 by grinding, etc., the light-transmissive member 50 is formed using a potting method or spray method. With this kind of method as well, by comprising the reinforcing member, warping of the substrate 10 is suppressed, so the top surface of the light emitting element 30 is exposed with good precision, the thickness of the light emitting device is uniform, and it is possible to have the light emitting device have little variation in light emission strength or color tone.

Cutting Step

The cutting step is a step of cutting the sealing member 70 and the substrate 10 between the unit mounting regions 11u to divide into individual light emitting devices. When there is the light-transmissive resin 80, the position of the alignment marks 3x, 3y are recognized via that, and cutting is done with the recognized alignment marks 3x, 3y as the reference.

Figure 5G:
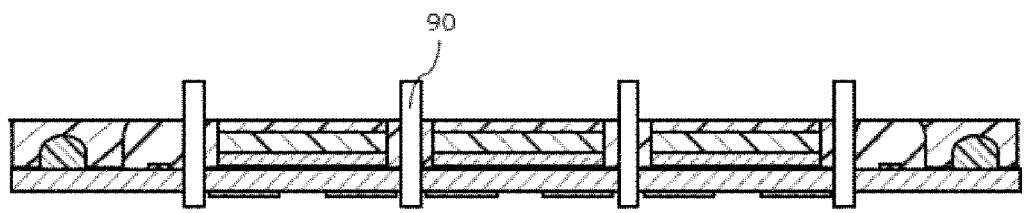
FIG. 5G is a schematic cross section view showing the method for manufacturing a light emitting device of an embodiment.
Figure 5H:
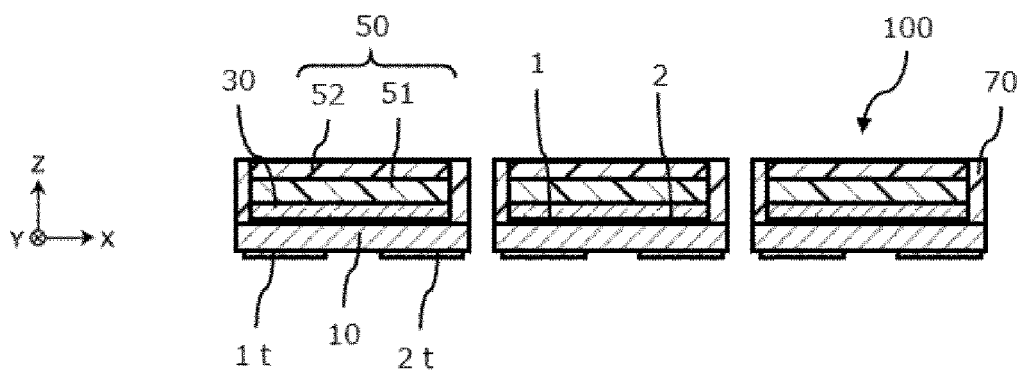
FIG. 5H is a schematic cross section view showing the method for manufacturing a light emitting device of an embodiment.

With the cutting step, as shown in FIG. 5G, the sealing member 70 of adjacent light emitting elements 30 and the substrate 10 are cut using a blade 90. When cutting the substrate 10 and the sealing member 70, by comprising the reinforcing member 81, warping of the substrate 10 and the sealing member 70 is suppressed, so it is possible to cut with good precision at desired cutting positions. By doing this, it is possible to suppress variation in the sin of the light emitting devices 100. In particular, it is easy to cut the width (thickness) of the sealing member 70 formed on the side surface of the light-transmissive member 50 and the side surface of the light emitting element 30. By doing this, it is possible to obtain the diced light emitting devices 100 as shown in FIG. 5H.

Also, by warping of the substrate 10 being suppressed by the reinforcing member 81 on the substrate 10, position skew of the alignment marks 3x, 3y is suppressed. By doing this, it is possible to recognize the alignment mark 3 with better precision, and possible to cut with good precision at the desired cutting position.

As noted above, by performing the cutting step with good position precision using the reinforcing member 81, it is possible to form the sealing member 70 for coating the side surface of the light-transmissive member 50 and the light emitting element 30 at a desired width.

Also, in the second region 16 of the periphery of the first region 11, the alignment marks 3 are preferably provided near the inside of the second region 16, and near the corners of the first region 1. By doing this, the distance of an adjacent pair of the alignment marks 3 is closer, errors that occur during recognition of the alignment marks 3 are suppressed, and it is possible to make the precision of the cutting position higher.

This cutting step can be performed using a dicer, for example. At that time, this can be performed without spraying water, or can be performed while spraying water. The light-transmissive member 50, when there is the second light-transmissive member 52 essentially containing the wavelength conversion substance 51b, it is preferable to cut without spraying water. By doing this, even when the wavelength conversion substance 51b contained in the first light-transmissive member 51 is a material with low moisture resistance, it is possible to suppress degeneration.

With the method for manufacturing a light emitting device of the embodiment explained above, it is possible to, form the sealing member 70 that coats the side surface of the light-transmissive member 50 and the side surface of the light emitting element 30 at a designated width with little variation in thickness. By doing this, for the side surface part of the light emitting element 30, it is not necessary to form the sealing member 70 at a thickness greater than necessary due to consideration of variation of the precision of the cutting position, making it possible to manufacture a small size light emitting device.

WORKING EXAMPLE 1

Substrate Preparation Step

First, as the substrate preparation step, the substrate 10 having the rectangular shape seen in the top view like that shown in FIG. 3A is prepared. The substrate 10 comprises the base which is the parent material, and the electrically conductive member for energizing the light emitting element. The base 18 is an approximately plate shaped BT resin of X direction length 90 mm, Y direction length 60 mm, and thickness 150 μm. The linear expansion coefficient of the base 18 is approximately 3 ppm/° C. The base 18 comprises the electrically conductive member that has Cu as the main component. The electrically conductive nether comprises the first land electrode 1 and the second land electrode 2 of the top surface of the base 18, and the first terminal electrode 1t and the second terminal electrode 2t of the bottom surface of the base 18. Furthermore, through holes at diameter 120 μm are comprised in the base 18, and connection terminals 1c, 2c are, comprised therein. The inside of the connection electrodes 1c, 2c in the through holes are respectively filled with epoxy resin.

The substrate 10 comprises the second, region 16 surrounding six first regions 11. Each first region 11 has an X direction length of 36 mm and Y direction length of 14 mm. The second region 16 is a frame shape that surrounds the six first regions 11. The second region 16 stretching in the X direction has an X direction width of 90 mm, and the second region 16 stretching in the Y direction has an X direction width of 60 mm. Also, the substrate 10 comprises the third regions 17 placed between adjacent first regions 11. The two third regions 17 stretching in the X direction have an X direction width of 78 mm. The one third region 17 stretching in the Y direction has a Y direction width of 50 mm.

Reinforcing Member Forming Step

Next, the first reinforcing member 81 and the first reinforcing member 82 are formed as shown in FIG. 4C. The first reinforcing member 81 is applied to the second region 16. Here, the first reinforcing members 81 are respectively formed on the second region 16, placed at left and right sandwiching the six first regions 11.

As the reinforcing members 81, 82, using modified silicone resin, linear silicate glass, spherical alumina, and spherical nano silica are added as an additive filler. The blend weight ratio is modified silicone resin:linear silicate glass:spherical alumina:spherical nano silica=10:15:10:0.5.

The reinforcing member is formed using the air dispensing method. Here, a dispenser comprising a 5 cc capacity syringe and a 1 mm opening diameter nozzle at the tip is used. The liquid reinforcing member is filled inside the syringe. The substrate 10 is laid on a flat support platform, and moves the dispenser that is placed there above. When moving, with the dispenser, the interior of the syringe is pressurized to 0.1 Pa, and while discharging the liquid reinforcing member from the nozzle, moving is done at a movement speed of 1 mm/s.

By applying as described above, formed are the two first reinforcing members 81A on the second region 16, and the one second rein forcing member 82A of the third region 17 like those shown in FIG. 4C. At this time, the first reinforcing members 81A have width of 3 mm and height of 0.2 mm, and the second reinforcing member 82 has width of 3 mm and height of 0.2 mm. All of the reinforcing members have a shape in the cross section view that is close to a semicircle.

Next, the substrate 10 on which the reinforcing members 81A, 82A are formed is placed inside an oven and heated. At this time, the temperature of the oven is 80° C. to 150° C., the heating time is 1 to 8 hours, and the atmosphere inside the oven is nitrogen or air. After that, the substrate is taken out from the oven, and natural cooling is done for 2 to 8 hours. During heating and cooling, the substrate 10 is fixed by tape onto a stainless steel plate.

Mounting Step

Next, as a joining member, a ball shaped AuSn (AuSn ball) is placed on the first land electrode 1 and the second land electrode 2 of the first region 11 of the substrate 10. Also, the ball diameter is 126 μm. Furthermore, a temporary fixing material is placed on the AuSn ball.

The light emitting element is mounted on the first land electrode and the second land electrode with the AuSn ball, etc., interposed, and heating is done for 0.2 hours at 320° C. in a reflow oven. Then, by cooling, the light emitting element 30 is joined with the first land electrode 1 and the second land electrode 2.

Light-Transmissive Member Placing Step

Next, the light-transmissive members 50 are placed on the light emitting elements 30 as shown in FIG. 5C. For the light-transmissive members 50, rectangular solids of 1200 μm×240 μm×225 μm molded in advance are used. A liquid adhesive agent (light guide, member) is placed on the light emitting elements 30 using a pin transfer method, and the light-transmissive members 50 are placed thereon. The adhesive agent can be placed on the side surface in addition to the top surface of the light emitting elements 30. As the adhesive agent, silicone resin is used.

The light-transmissive member 50 is a light-transmissive resin material, and contains silicone resin as the parent material. Here the light-transmissive member 50 has a laminated structure, and the top side is the second light-transmissive member 52 that essentially does not contain the wavelength conversion substance, and the bottom side is the first light-transmissive member 51 that does contain the wavelength conversion substance. As the wavelength conversion substance, contained are β sialon based phosphor (e.g. $Si_{6-z}Al_zO_zN_{8-z}$:Eu (0<z<4.2)), and manganese activated potassium fluorosilicate phosphor (e.g. $K_2SiF_6$:Mn).

The light-transmissive member 50 is suctioned using a collet, and placed on the adhesive agent on the light emitting element 30. At that time, a portion of the adhesive material sticking out from the joining surface of the light-transmissive member 50 and the light emitting element 30 is formed on the side surface of the light emitting element 30, and a fillet shape is formed. After that, heating is done at 170° C. using an oven, and the adhesive agent is hardened.

Next, a portion of the outer circumference part of the light-transmissive member 50 undergoes dry grinding using a dicer. After that, dry ice is sprayed on the side surface of the light-transmissive member 50 to remove the scraps of the light-transmissive member 50.

Alignment Mark Coating Step

Next, the light-transmissive resin 80 that coats the alignment marks 3 is formed. The height of the light-transmissive resin 80 is higher than the top surface of the light-transmissive member 50.

Sealing Member Forming Step

Next, as shown in FIG. 5E, the sealing member 70 is formed on the first region 11 and the second region 16 on the substrate 10. At this time, the sealing member is formed at a height of approximately 0.5 mm to also embed the light-transmissive member 50 placed on the light emitting element 30 of the first region 11. The sealing member 70 is formed using transfer mold molding. The sealing member 70 is a resin material containing titanium oxide at 60 weight % in the silicone resin.

After the sealing member is hardened, a portion of the sealing member 70 is ground so as to expose a portion of the second light-transmissive member 52.

Cutting Step

Finally, the substrate 10 and the sealing member 70 are cut using a dicer, and divided into individual light emitting devices 100. In one first region 11, approximately 5000 light emitting devices 100 are obtained. The light emitting devices 100 have an approximately rectangular solid outline in shown in FIG. 1, and as the design value, the X direction length (width) is 1.5 mm, the Y direction length (depth) is 0.3 mm, and the Z direction length (height) is 0.46 min. With respect to this, of the obtained light emitting devices 100, 98% or greater are good articles with sizes within the standard.

What is claimed is:
1. A method for manufacturing a light emitting device comprising:
preparing a substrate having a first region on which a plurality of light emitting devices are formed, and a second region surrounding the first region;
forming a reinforcing member by applying a resin material on the second region and hardening the resin material, the reinforcing member having an inner side surface facing the first region, an outer side surface on an opposite side of the inner side surface, and a top surface connecting the inner side surface and the outer side surface;
mounting a plurality of light emitting elements on the first region;
forming a plurality of light-transmissive members respectively on the light emitting elements so that a top surface of each of the light-transmissive members is positioned higher than a top surface of the reinforcing member;
sealing the reinforcing member, the plurality of light emitting elements and the plurality of light-transmissive members using a sealing member, a height of the sealing member being larger than a height of the reinforcing member as measured from a surface of the substrate such that the sealing member covers the top surface, the inner side surface and the outer side surface of the reinforcing member; and cutting the substrate and the sealing member at prescribed cutting positions and separating into individual light emitting devices, one of the prescribed cutting positions is disposed between the reinforcing member and at least one of the light emitting elements adjacent to the reinforcing member so that none of the individual light emitting devices includes the reinforcing member.

2. The method for manufacturing a light emitting device according to claim 1, wherein
the preparing of the substrate includes preparing the substrate to have a plurality of the first regions, and a third region placed between adjacent ones of the first regions,
the forming of the reinforcing member includes forming a first reinforcing member on the second region, and forming a second reinforcing member on the third region, and
the cutting of the substrate and the sealing member includes cutting the substrate and the sealing member at the prescribed cutting positions including a first cutting position and a second cutting position, the first cutting position being disposed between the first reinforcing member and at least one of the light emitting elements adjacent to the first reinforcing member, and the second cutting position being disposed between the second reinforcing member and at least one of the light emitting elements adjacent to the second reinforcing member, so that none of the individual light emitting devices includes the first reinforcing member or the second reinforcing member.

3. The method for manufacturing a light emitting device according to claim 2, wherein
the first reinforcing member is continuous with the second reinforcing member.

4. The method for manufacturing a light emitting device according to claim 2, wherein
the first reinforcing member is separated from the second reinforcing member.

5. The method for manufacturing a light emitting device according to claim 2, wherein
the first reinforcing member is a frame shape.

6. The method for manufacturing a light emitting device according to claim 2, wherein
the second reinforcing member is in a linear shape.

7. The method for manufacturing a light emitting device according to claim 2, wherein
the first reinforcing member is thicker than the substrate.

8. The method for manufacturing a light emitting device according to claim 2, wherein
the second reinforcing member is thicker than the substrate.

9. The method for manufacturing a light emitting device according to claim 1, wherein
a base material of the substrate is one of epoxy resin, bismaleimide triazine (BT) resin, polyimide resin, cyanate resin, polyvinyl acetal resin, phenoxy resin, acrylic resin, alkyd resin, and urethane resin.

10. The method for manufacturing a light emitting device according to claim 2, wherein
the first reinforcing member or the second reinforcing member is one of silicone resin, modified silicone resin, hybrid silicone resin, and epoxy resin.

11. The method for manufacturing a light emitting device according to claim 2, wherein
the first reinforcing member or the second reinforcing member contains a filler, and the filler contains at least one of alumina, silica, titania, and aluminoborosilicate glass.

12. The method for manufacturing a light emitting device according to claim 2, wherein
the first reinforcing member or the second reinforcing member contains a filler, and a blending quantity of the filler is 1 weight % to 80 weight %.

13. The method for manufacturing a light emitting device according to claim 2, wherein
an application method of the first reinforcing member or the second reinforcing member is one of an air dispensing method, spraying, or printing.

14. A method of manufacturing a light emitting device comprising:
preparing a substrate having a first region on which a plurality of light emitting devices are formed, and a second region surrounding the first region;
forming a reinforcing member by applying a resin material on the second region and hardening the resin material, the reinforcing member having an inner side surface facing the first region, an outer side surface on an opposite side of the inner side surface, and a top surface connecting the inner side surface and the outer side surface;
mounting a plurality of light emitting elements on the first region;
forming a plurality of light-transmissive members respectively on the light emitting elements;
sealing the reinforcing member, the plurality of light emitting elements and the plurality of light-transmissive members using a sealing member, a height of the sealing member being larger than a height of the reinforcing member as measured from a surface of the substrate such that the sealing member covers the top surface, the inner side surface and the outer side surface of the reinforcing member;
after the sealing of the reinforcing member, the plurality of light emitting elements and the plurality of light-transmissive members using the sealing member, removing a part of the sealing member to expose a part of the light-transmissive member; and
cutting the substrate and the sealing member at prescribed cutting positions and separating into individual light emitting devices, one of the prescribed cutting positions is disposed between the reinforcing member and at least one of the light emitting elements adjacent to the reinforcing member so that none of the individual light emitting devices includes the reinforcing member.

15. The method of manufacturing a light emitting device according to claim 1, further comprising
after the sealing of the reinforcing member, the plurality of light emitting elements and the plurality of light-transmissive members using the sealing member, removing a part of the sealing member to expose a part of the light-transmissive member.

* * * * *